United States Patent
Forrest et al.

(10) Patent No.: US 9,029,837 B2
(45) Date of Patent: May 12, 2015

(54) PHOTOACTIVE DEVICES INCLUDING PORPHYRINOIDS WITH COORDINATING ADDITIVES

(75) Inventors: Stephen R. Forrest, Ann Arbor, MI (US); Jeramy Zimmerman, Ann Arbor, MI (US); Eric K. Yu, Ann Arbor, MI (US); Mark E. Thompson, Anaheim, CA (US); Cong Trinh, Los Angeles, CA (US); Matthew Whited, Northfield, MN (US); Vlacheslav Diev, Los Angeles, CA (US)

(73) Assignee: The Regents of The University of Michigan, Ann Arbor, MI (US)

( * ) Notice: Subject to any disclaimer, the term of this patent is extended or adjusted under 35 U.S.C. 154(b) by 686 days.

(21) Appl. No.: 13/271,993

(22) Filed: Oct. 12, 2011

(65) Prior Publication Data

US 2015/0048314 A1    Feb. 19, 2015

Related U.S. Application Data

(60) Provisional application No. 61/404,983, filed on Oct. 12, 2010.

(51) Int. Cl.
| | |
|---|---|
| *H01L 51/00* | (2006.01) |
| *H01L 51/42* | (2006.01) |
| *H01L 51/50* | (2006.01) |
| *H01L 51/56* | (2006.01) |

(52) U.S. Cl.
CPC ........ *H01L 51/0092* (2013.01); *H01L 51/0047* (2013.01); *H01L 51/0078* (2013.01); *H01L 51/4253* (2013.01); *H01L 51/5012* (2013.01); *H01L 51/56* (2013.01); *H01L 51/0003* (2013.01); *H01L 51/001* (2013.01); *H01L 51/0046* (2013.01); *H01L 51/0077* (2013.01); *H01L 51/424* (2013.01); *H01L 51/5056* (2013.01); *H01L 51/5072* (2013.01)

(58) Field of Classification Search
CPC .................................................. H01L 51/0092
See application file for complete search history.

(56) References Cited

U.S. PATENT DOCUMENTS

| | | | | |
|---|---|---|---|---|
| 7,528,003 | B2 * | 5/2009 | Liu | 438/99 |
| 8,519,381 | B2 * | 8/2013 | Oyamada | 257/40 |

(Continued)

OTHER PUBLICATIONS

Diev, Vyacheslav V., et al., "Fused Pyrene-Diporphyrins: Shifting Near-Infrared Absorption to 1.5 μm and Beyond", Agnew. Chem., vol. 122, pp. 5523-5526, Jul. 2, 2010.

(Continued)

*Primary Examiner* — Stephen W Smoot
(74) *Attorney, Agent, or Firm* — Reising Ethington P.C.

(57) ABSTRACT

Coordinating additives are included in porphyrinoid-based materials to promote intermolecular organization and improve one or more photoelectric characteristics of the materials. The coordinating additives are selected from fullerene compounds and organic compounds having free electron pairs. Combinations of different coordinating additives can be used to tailor the characteristic properties of such porphyrinoid-based materials, including porphyrin oligomers. Bidentate ligands are one type of coordinating additive that can form coordination bonds with a central metal ion of two different porphyrinoid compounds to promote porphyrinoid alignment and/or pi-stacking. The coordinating additives can shift the absorption spectrum of a photoactive material toward higher wavelengths, increase the external quantum efficiency of the material, or both.

28 Claims, 18 Drawing Sheets

(56) References Cited

U.S. PATENT DOCUMENTS

| | | | |
|---|---|---|---|
| 8,658,290 B2 * | 2/2014 | Koenemann et al. | 428/690 |
| 2007/0227590 A1 | 10/2007 | Fukuzumi | |
| 2009/0308458 A1 * | 12/2009 | Aramaki et al. | 136/263 |
| 2010/0084011 A1 | 4/2010 | Forrest et al. | |
| 2013/0008503 A1 * | 1/2013 | McGrath et al. | 136/256 |

OTHER PUBLICATIONS

International Search Report for application PCT/US2011/056011, Apr. 30, 2012, 2 pages.

* cited by examiner

PHOTOACTIVE DEVICES INCLUDING PORPHYRINOIDS WITH COORDINATING ADDITIVES

CROSS-REFERENCE TO RELATED APPLICATION

This application claims the benefit of U.S. Provisional Application No. 61/404,983, filed Oct. 12, 2010, the entire contents of which are hereby incorporated by reference.

GOVERNMENT LICENSE RIGHTS

This invention was made with government support under W15P7T-08-C-P409 awarded by the U.S. Army Communications-Electronics Command (CECOM) and DE-SC000103 awarded by the U.S. Department of Energy. The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

TECHNICAL FIELD

The invention relates to organic photoactive devices and additive-modified porphyrinoid-based materials that can be used to construct photoactive devices.

BACKGROUND OF THE INVENTION

Organic photoelectric materials have shown promise for use in electronics and other electrical applications where bending, stretching, or other shape-conforming properties are desirable and where low temperature material deposition is desirable in the manufacturing process, such as with plastic substrates. While organic photoelectric materials may offer certain cost and flexibility advantages over more traditional inorganic photoelectrics, such as silicon-based photovoltaic materials, their use in such applications has been limited by relatively low efficiencies and by the limited portion of the electromagnetic spectrum in which they can typically operate.

SUMMARY

According to one aspect of the invention, an organic photoactive device is provided that includes a substrate, first and second electrodes supported by the substrate, and a donor material and an acceptor material arranged together to form a heterojunction between the first and second electrodes. At least one of the donor or acceptor materials includes a metallated porphyrinoid and at least one coordinating additive.

According to another aspect of the invention, a photoactive device is provided that includes a substrate, first and second electrodes supported by the substrate, and a fullerene compound and a material arranged together between the electrodes as a heterojunction with the fullerene compound. The heterojunction-forming material has a supramolecular structure comprising metal ions coordinated with both macrocyclic ligands and bidentate axial ligands. The axial ligands form coordination bonds with the coordinated central metal ions of adjacent macrocyclic ligands.

In accordance with another aspect of the invention, a method of making a photoactive device is provided that includes the steps of: (a) depositing a metallated, porphyrinoid-based material over a substrate; (b) depositing a coordinating additive over the substrate; and (c) depositing a material that can form a heterojunction with the metallated, porphyrinoid-based material over the substrate. The coordinating additive includes a compound having at least one nitrogen free electron pair.

In accordance with another aspect of the invention, a method of modifying the photoelectric properties of an organic photoactive material includes the steps of: (a) providing a photoactive material having a characteristic EQE spectrum with at least one EQE peak when paired with another material to form a heterojunction; and (b) adding at least one coordinating additive to the material that shifts the at least one EQE peak toward higher wavelengths or increases a maximum value of the at least one EQE peak, or both. The photoactive material comprises a metallated porphyrin dimer or trimer.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE ILLUSTRATED EMBODIMENT(S)

Porphyrinoids, such as porphyrins, phthalocyanines, and their related compounds, include macrocyclic molecular structures that can bind with metal ions at their central openings. These types of organic compounds can exhibit semiconductive properties when paired with other heterojunction-forming materials. These types of compounds and heterojunction pairings typically have light absorption or emission bands in the visible portion of the electromagnetic spectrum with minimal or no absorption in the higher wavelength portions of the spectrum, such as the near infrared or infrared. The teachings presented herein may be used to construct photoactive devices using porphyrinoid-based materials that include coordinating additives tailored to shift the absorption band of the base porphyrinoids toward higher wavelengths, to increase the external quantum efficiency of devices made therefrom, or both. Other advantages will become apparent as well. The coordinating additives may be selected to coordinate the locations of the centers of the macrocyclic porphyrinoid structures with one another by linking central metal ions of different macrocycles together or by otherwise causing them to stack and/or align with one another in parallel planes.

Figure 1:
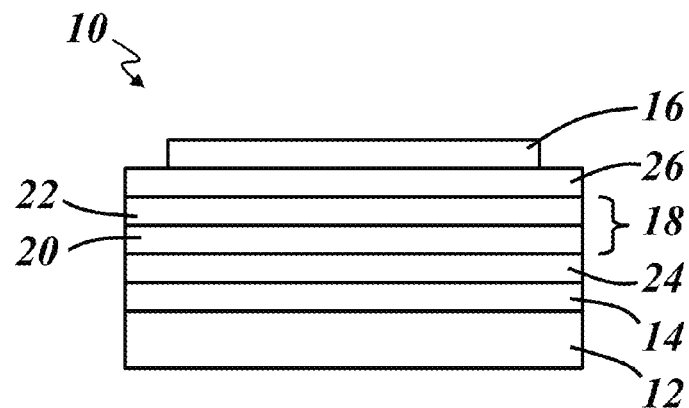
FIG. 1 is a schematic cross-sectional view of one embodiment of a photoactive device with a bilayer heterojunction arranged between a pair of electrodes.
Figure 2:
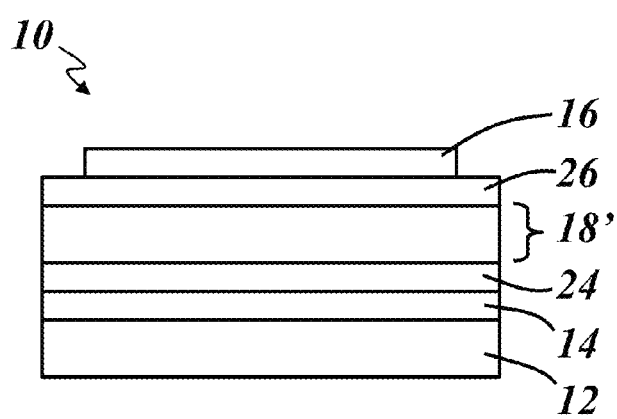
FIG. 2 is a schematic cross-sectional view of another embodiment of the photoactive device of FIG. 1 with a bulk heterojunction arranged between the electrodes.
Figure 3:
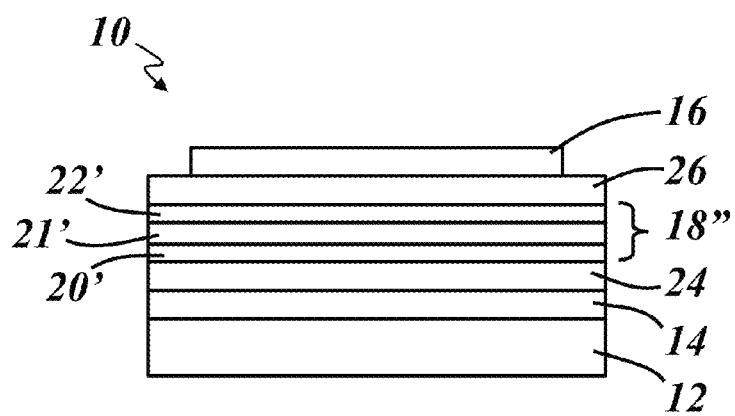
FIG. 3 is a schematic cross-sectional view of another embodiment of the photoactive device of FIG. 1 with a planar-mixed heterojunction arranged between the electrodes.

FIGS. 1-3 illustrate various examples of photoactive device configurations that may be constructed from the materials described herein. Photoactive devices include both photoreactive devices and light-emitting devices. Photoreactive devices broadly include devices that use light energy to provide some other usable effect, such as photovoltaic devices that react to light by producing an electrical potential, or photoconductive devices that react to light by increasing the electrical conductivity in some portion of the device. Light-emitting devices broadly include devices that produce light in response to an applied electrical potential or to a change in an otherwise induced change in electrical conductivity, for example. One example of a light-emitting device is a light-emitting diode, also known as an organic LED or OLED when constructed using organic materials such as porphyrinoids.

Referring to FIG. 1, a photoactive device 10 is shown according to one embodiment. This example of photoactive device 10 includes a substrate 12, first and second electrodes 14, 16, and a heterojunction 18 arranged between the electrodes. In the illustrated embodiment, heterojunction 18 is a planar or bilayer heterojunction that includes a layer of donor material 20 and a layer of acceptor material 22 stacked together to form the heterojunction at an interface between the layers. In one embodiment, donor material 20 is a material that includes a porphyrinoid and a coordinating additive, as will be subsequently described in greater detail. Acceptor material 22 is any material that can form a heterojunction with the donor material 20. In one embodiment, layer 22 is constructed from a fullerene compound, such as $C_{60}$, $C_{70}$, $C_{84}$, carbon nanotubes (CNTs), or some functionalized or substituted variation thereof. Substrate 12 supports electrodes 14, 16 and any additional intervening, overlying, or underlying layers of material. The substrate can be made from any suitable material with a smooth surface, such as glass, quartz, silicon, metal, plastic, or any other type of material. In some embodiments, it is useful to construct the substrate 12 from a material that is transparent to light in the particular wavelength range of interest. First and second electrodes 14, 16 may be constructed from any suitable material that is electrically conductive. Optical transparency of the electrode material may also be considered when selecting electrode materials and thicknesses in certain applications. Electron orbital energy alignment with the highest occupied molecular orbital (HOMO) and lowest unoccupied molecular orbital (LUMO) of the materials used to form the heterojunction 18 may also be considered when selecting electrode materials.

In one embodiment, photoactive device 10 is a photodetector, substrate 12 is transparent to visible light, and first electrode 14 is an anode that is constructed from a material that is transparent to visible light. In this example, a suitable material for the anode 14 is indium tin oxide (ITO), which is transparent in thin layers and aligns sufficiently well with the HOMO of certain materials, such as some of the porphyrinoids described herein. With the bilayer heterojunction 18 of FIG. 1, the HOMO of interest is that of layer 20, or the donor layer in this example. Second electrode 16 may be selected for energy alignment with the LUMO of the acceptor material, or layer 22 in the example of FIG. 1. Where device 10 is photoreactive, second electrode 16 is a cathode, and silver metal is one example of a suitable electrode material. Aluminum or other materials may also be suitable depending on the materials used to form heterojunction 18 and other factors.

Also included in the photoactive device 10 of FIG. 1 are first and second buffer layers 24, 26. These layers are not always necessary, but one or both of them may be included. First buffer layer 24 is located over the substrate 12 and the first electrode 14, and is in contact with both the substrate and the first electrode in this example. With photoreactive devices, it may also be useful for buffer layer 24 to be transparent where present. Some examples of suitable buffer layer materials for arrangement between electrode 14 and the heterojunction 18 include poly(3,4-ethylenedioxythiophene)-poly(styrenesulfonate) (PDOT-PSS), molybdenum oxide, or perylenetetracarboxylic bisbenzimidazole (PTCBI). Buffer layer 24 may serve as a leveling or planarizing layer in preparation for the deposition of subsequent layers. Buffer layer 26 may be included to protect other underlying layers during subsequent deposition steps, and/or as an exciton-blocking layer. In one embodiment, buffer layer 26 is bathocuproin, but PTCBI or other materials may be used. Materials for both of the buffer layers 24, 26 may be selected at least partly based on their electrical conductivity so that they do not significantly interfere with electron flow between the heterojunction 18 and the electrodes 14, 16.

FIGS. 2 and 3 illustrate other embodiments of photoactive device 10, where the heterojunction between the electrodes is in a different configuration than in FIG. 1. For example, FIG. 2 illustrates a bulk heterojunction 18'. A bulk heterojunction may be formed when an electron donor material and an electron acceptor material are co-deposited or otherwise mixed together to form a single layer of material as shown. For example, the different materials deposited as layers 20 and 22 in the device of FIG. 1 are co-deposited or otherwise arranged as bulk heterojunction layer 18' in FIG. 2. Some phase separation between the donor and acceptor materials may occur within the layer to form this type of heterojunction. FIG. 3 shows another type of heterojunction 18" that includes three regions or sublayers 20', 21', and 22'. Sublayer 20' may be constructed from the donor material 20 of FIG. 1, sublayer 22' may be constructed from the acceptor material 22 of FIG. 1, and sublayer 21' may be a mixture of the donor and acceptor materials, as in a bulk heterojunction layer. This three-layer construction may be known as a planar-mixed heterojunction 18".

The above-described photoactive devices are only examples. They may include additional layers or other components and/or be a part of larger photoactive systems. While generally described in the context of photodetecting devices in the following discussion, it should be appreciated that the disclosed porphyrinoid materials are suitable for any application where semi-conducting material properties are useful. As noted above, a heterojunction can be formed as a junction between an electron donor material and an electron acceptor material. One or both of the acceptor and donor material of a given heterojunction can be made from the modified porphyrinoid materials as set forth below. Hereafter, such porphyrinoid materials with and without additives may also be referred to as photoactive materials, with the understanding that the materials are photoactive when paired with another material to form a heterojunction.

Figure 4:
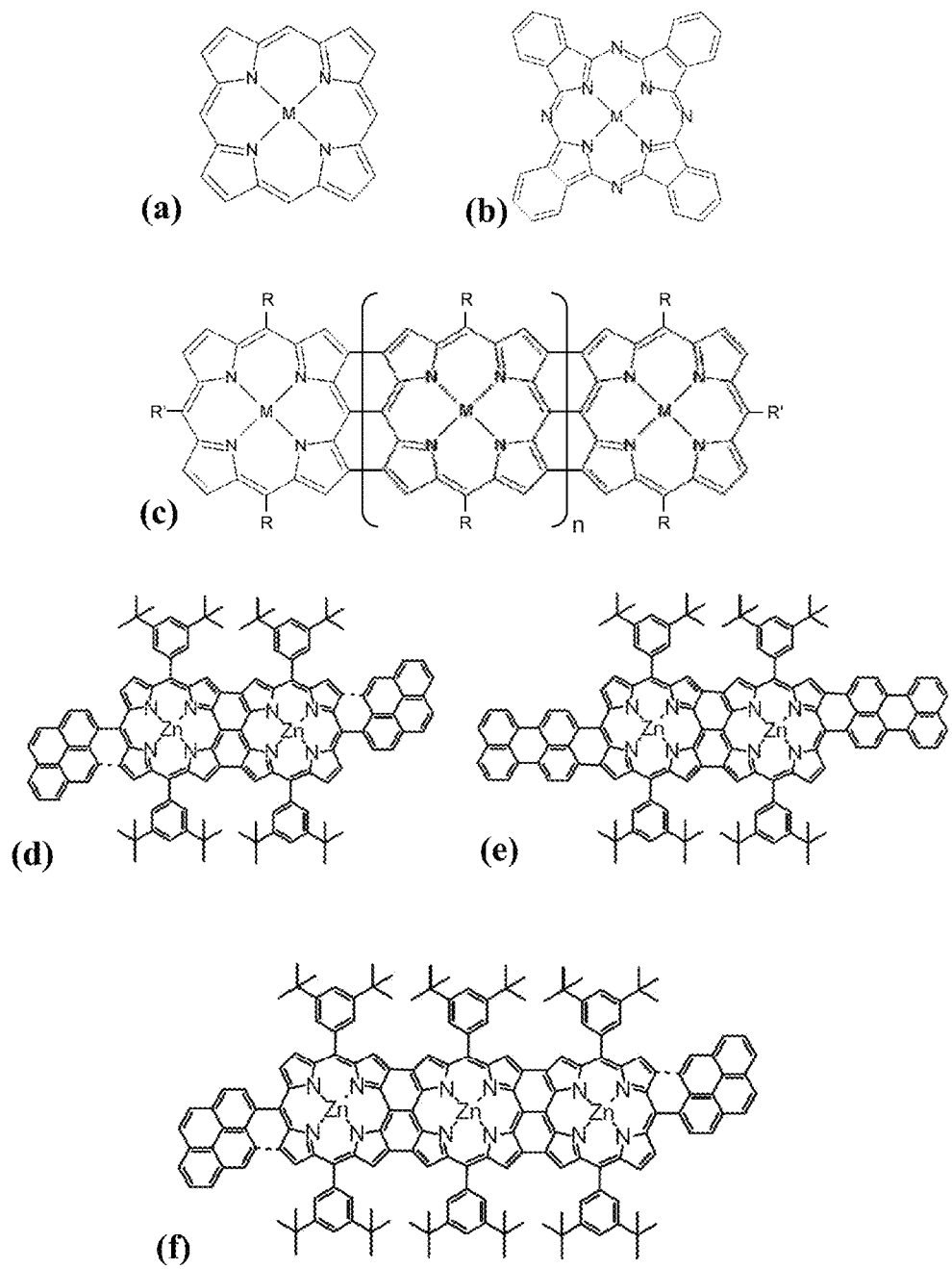
FIG. 4 illustrates various examples of metallated porphyrinoid compounds, including: a) metallated porphyrin, b) metallated phthalocyanine, c) a metallated porphyrin oligomer, d) a zinc-metallated porphyrin dimer with pyrene terminal groups, e) a zinc-metallated porphyrin dimer with fused perylene terminal groups, and f) a zinc-metallated porphyrin trimer.

As used herein, the term "porphyrinoid" refers to any multipyrrolic macrocyclic compound, where the pyrrole groups are connected at their α carbon atoms via a linking or bridging atom and the nitrogen of each pyrrole group is arranged at the interior of the macrocycle. A porphyrinoid may include functional groups, heteroatoms, fused cyclic groups, or other substitutions anywhere along its outer perimeter. FIGS. 4(a) and 4(b) illustrate some examples of porphyrinoids. A metallated porphyrin is illustrated in FIG. 4(a), which is metallated porphine in this instance. Porphine is the simplest of the porphyrins, and the term "porphyrin" refers to tetrapyrrolic porphyrinoids where the linking atom between pyrrole groups is a carbon atom. As with porphyrinoids, porphyrins may include functional groups, heteroatoms, fused cyclic groups, or other substitutions anywhere along their outer perimeter. A metallated phthalocyanine is illustrated in FIG. 4(b). The term "phthalocyanine" refers to porphyrinoids where the linking atom between pyrrole groups is a nitrogen atom and where a benzene ring is attached at both β positions of each pyrrole group. Phthalocyanine may thus be considered a particular substituted porphyrin as well (tetrabenzotetraazaporphyrin). While both of the porphyrinoids of FIG. 4 are tetrapyrrolic macrocycles, other porphyrinoids may have more or less pyrrole groups. For example, boron chloride subphthalocyanine is a tripyrrolic porphyrinoid with only three pyrrole groups. Other porphyrinoids may have five or more pyrrole groups.

The photoactive material is also considered to include a porphyrinoid when it includes a compound that has multiple porphyrinoids bonded together. One example of such a compound is a porphyrinoid oligomer. As used herein, porphyrinoid oligomers are compounds having porphyrinoids covalently bonded together and with the terminal porphyrinoids covalently bonded to only one other porphyrinoid. The general structure for an illustrative porphyrin oligomer or polymer is shown in FIG. 4(c). The R groups can be the same or different along the structure, and terminal groups R' can also be the same or different. Both of the R and R' groups can be omitted entirely, and the repeating unit can be substituted or functionalized in other ways. It is preferred that n=0 or n=1, to arrive at a porphyrin dimer or trimer, respectively, but larger values for n are possible. Dimers and trimers are considered oligomers, as is any compound with porphyrinoid repeating units where n is known. In the example shown in FIG. 4(c), and in the other figures that show oligomers, the porphyrinoids are covalently bonded at three locations in a (β, meso, β) mode. These types of oligomers may also be referred to as porphyrinoid "tapes" due to their generally flat, elongated configuration. Compounds having only one or two covalent bonds between porphyrinoid repeating units are also considered to be porphyrinoid oligomers. These covalent bonds can be meso-meso, beta-beta, or beta-meso bonds. Porphyrinoid oligomers additionally include co-oligomers where more than one different porphyrinoid is present in the repeating unit or oligomers that include porphyrinoids covalently linked together in a repeating fashion with intervening organic groups in place of the direct covalent bond(s) with each other.

FIGS. 4(d)-(f) show specific examples of materials including porphyrinoids. In particular, porphyrin dimers and trimers are shown. FIG. 4(d) shows a metallated porphyrin dimer with zinc as the central metal ion for each of the porphyrin repeating units. The illustrated dimer also includes ditertbutylphenol lateral substitutions and pyrene terminal groups. The bonds shown as dashed lines between each pyrene terminal group and a porphyrin unit are optional covalent bonds. Where those bonds are included, the terminal group is said to be "fused," as it limits the rotation of the terminal group about a single bond. For example, the porphyrin dimer shown in FIG. 4(e) includes fused terminal groups. In particular, the terminal groups shown in FIG. 4(e) are fused perylene terminal groups. FIG. 4(f) shows a porphyrin trimer metallated with zinc and including the same lateral substitutions and terminal groups as the dimer of FIG. 4(d). Occasional reference will be made in the figures and their accompanying descriptions to "Psub" and "Pfused." These terms distinguish between oligomers with singly bonded terminal groups (Psub) and fused terminal groups (Pfused). Certain fused terminal groups can help to extend the π-conjugation of the molecule, and some terminal groups can impose a slight twist in the oligomer backbone. Polycyclic aromatic terminal groups such as pyrene and perylene are suitable terminal groups. Some non-limiting examples of other possible terminal groups are disclosed in co-pending U.S. patent application Ser. No. 12/868,503, filed on Aug. 25, 2010.

The central metal ion of each porphyrinoid can be nearly any metal ion, but typically has a $2^+$ or $3^+$ charge and forms coordination bonds with the central nitrogen atoms of the porphyrinoid. The metallated porphyrinoid may also be described as a metal complex of a macrocyclic ligand or, more specifically, as a metal complex of a porphyrinoid. Zinc (Zn) is one suitable metal ion for the photoactive material. Lead (Pb) is another suitable choice for the central metal ion.

Figure 5:
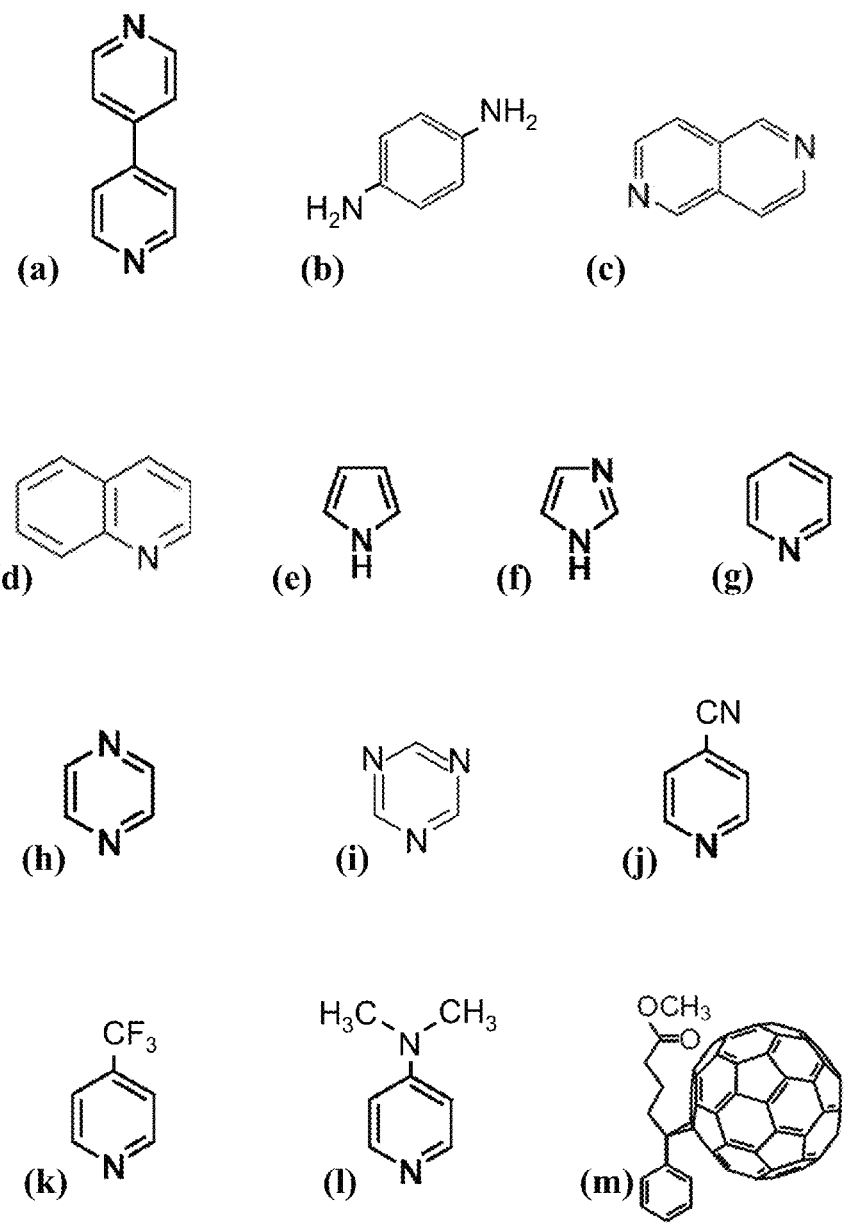
FIG. 5 illustrates various examples of coordinating additives, including: a) 4,4'-bipyridyl, b) 1,4-diaminobenzene, c) 2,6-naphthyridine, d) quinoline, e) pyrrole, f) imidazole, g) pyridine, h) pyrazine, i) triazine, j) pyridine-4-carbonitrile, k) 4-trifluoromethylpyridine, l) dimethyl amino pyridine, and m) a fullerene compound.

As already noted, the photoactive material also includes at least one coordinating additive. A coordinating additive is an organic compound that interacts with and coordinates the relative locations of the centers of adjacent porphyrinoids in the material that are not covalently bonded with each other. In other words, a coordinating additive helps bring order to the photoactive material by matching up the various centers of the porphyrinoids to promote more stable π-stacking of the porphyrinoids in the material. This coordination between adjacent or stacked porphyrinoids may occur through at least two different mechanisms. One type of coordinating additive is a ligand having at least one free electron pair available to interact with the central metal ions of the porphyrinoids. This type of coordinating additive can form coordination bonds with the central metal ion of one or more metallated porphyrinoids. Another type of coordinating additive relies on strong π-π interactions between the large aromatic system of the porphyrinoid and the additive itself to coordinate porphyrinoid centers with each other. For example, a fullerene compound is a large aromatic system that can coordinate porphyrinoids in this manner. Fullerene compounds include the generally spherical fullerene $C_{60}$, and substituted versions thereof, as well as CNTs and their substituted versions. In addition to their strong π-π interactions with porphyrinoids, $C_{60}$ and its substituted variations have a physical size and curved shape that make it a suitable fit for the porphyrinoid centers. CNTs may be tailored to be physically sized for effective coordination between porphyrinoids. One example of a fullerene compound that may be used as a coordinating additive is [6,6]-phenyl-C61-butyric acid methyl ester (PCBM), shown in FIG. 5(m). Either type of coordinating additive results in a porphyrinoid-based supramolecular structure in the photoactive material.

FIGS. 5(a)-(l) show several examples of coordinating additives of the ligand type. These non-limiting examples can form coordination bonds with the central metal ions of the metallated porphyrinoids in the material. These types of coordinating additives are organic compounds that include one or more free electron pair(s) to interact with the metal ions in the material. In one embodiment, the coordinating additive is a compound having one or more nitrogen free electron pair. In another embodiment, the coordination additive is a compound having two or more free electron pairs. Free electron pairs may be provided by nitrogen atoms or other atoms, such as the oxygen atom of a carbon monoxide or carboxylic acid. The number of free electron pairs available in a compound to interact or form coordination bonds with metal ions determines its denticity. A ligand may be monodentate, bidentate, tridentate, etc. Any ligand having more than one free electron pair may be referred to as multidentate. Some of these characteristics of ligands as coordinating additives will be described by way of example with reference to FIG. 5.

FIGS. 5(a)-5(c) show 4-4'-bipyridyl, 1,4-diaminobenzene, and 2,6-naphthyridine, respectively. These are all examples of bidentate ligands having two nitrogen free electron pairs. These particular examples may also be referred to as axial ligands in the context of their use with metallated macrocycles as coordinating additives. Such axial ligands have a free electron pair located at each of the opposite ends of the ligand so that each end can form a coordination bond with a different metallated porphyrinoid. Variations of these examples, such as a dipyridyl with the linking bond at the 3-carbon of one or both pyridyls, may also function as axial ligands, but a structure with the free electron pairs at symmetrically opposite ends of the ligand is preferred, as is the case with 4-4'-bipyridyl and 1,4-diaminobenzene. Other examples of bidentate ligands include imidazole, pyrazine, pyradine-4-carbonitrile, and dimethyl amino pyridine, shown in FIGS. 5(e), 5(h), 5(j), and 5(l), respectively. Pyrazine is another example of a coordinating additive that includes free electron pairs at symmetrically opposite ends of the compound and may act as an axial ligand in certain systems. Examples of monodentate ligands having only one free electron pair include quinoline, pyrrole, pyridine, and 4-trifluoromethylpyridine, shown in FIGS. 5(d), 5(e), 5(g), and 5(k), respectively. FIG. 5(i) shows trizazine, which is an example of a tridentate ligand.

These are but a few examples of coordinating additives, and any number and combination of these and other coordinating additives may be included in the photoactive material. The material may include a fullerene compound and/or one or more compounds with at least one free electron pair. In one embodiment, the additive includes a bidentate ligand, and in some embodiments it is an axial ligand.

A method of making a photoactive device, such as those depicted schematically in FIGS. 1-3 can now be described. In one embodiment, the method includes the steps of depositing a metallated porphyrinoid-based material over a substrate, depositing a coordinating additive as described above over the substrate, and depositing a material that can form a heterojunction with the metallated porphyrinoid-based material over the substrate. In one embodiment, the porphyrinoid-based material and the coordinating additive(s) are co-deposited from solution in a common solvent that is allowed to evaporate after the solution is deposited over the substrate. Each one of the deposition steps can be conducted using the same or different ones of the following processes: spin casting, film casting, doctor blading, vacuum thermal evaporation, or organic vapor phase deposition. Additional layers, such as electrode layers and/or buffer layers may be deposited using any of these processes as well.

In one particular embodiment, a coordinating additive can be added to the porphyrinoid-based material by subsequent deposition of the additive. One method that can accomplish this is vapor deposition, where the deposited porphyrinoid-based material is exposed to a vapor that includes one or more coordinating additives. This type of vapor deposition process may be conducted at ambient conditions, such as atmospheric pressure and room temperature, but other pressures and temperatures may be used. It can be performed any time during the construction of a photoactive device where it is desired to include a coordinating additive in an already deposited layer of porphyrinoid material and may be performed either before or after any overlying buffer layer. These and other embodiments will become apparent with reference to the following experimental examples.

Experimental Examples

The following descriptions of experimental examples are directed at non-limiting photoactive device structures and methods for making them and are disclosed here to demonstrate one or more advantages that may be realized by the teachings presented herein. To obtain the following experimental results, organic photodetectors were constructed in bilayer heterojunction form. A first set of experiments was directed at embodiments where coordinating additives were co-deposited in solution with the porphyrinoid and are discussed in conjunction with FIGS. 6-19. A second set of experiments was directed at embodiments where coordinating additives were deposited by vapor deposition after the deposition of the porphyrinoid and are discussed in conjunction with FIGS. 20-24.

In the first set of experiments, the donor layer included porphyrin oligomers, some with one or more coordinating additives, and was deposited via solution with chlorobenzene as the solvent. Typical solution preparation included preparation of porphyrin oligomer solutions in a solvent including chlorobenzene with 5% pyridine with oligomer concentrations of 10 mg/ml. One or more coordinating additives were separately dissolved in chlorobenzene at the desired concentrations and added to the oligomer solutions, which were then further diluted to a 5 mg/ml oligomer concentration. The acceptor layer was $C_{60}$ and was deposited by vacuum thermal evaporation. The two types of coordinating additives included in the donor layers in different combinations were fullerene compounds, particularly PCBM, and pyridine-based compounds. As discussed below, reference is made interchangeably to the photoactive material itself and the devices that include the material—i.e., properties of the photoactive device may be described as properties of the material for the sake of convenience.

To fabricate experimental photoactive devices, a 45 nm-thick planarizing layer of PDOT-PSS was deposited on ITO-coated glass substrates. The ITO coating was about 150 nm thick and included as an electrode material. Donor materials were then deposited over the substrate at about 100° C. with a film casting knife, resulting in film thicknesses of about 60±12 nm. This was followed by vacuum thermal deposition of a 125 nm-thick $C_{60}$ acceptor material layer, a 10 nm-thick bathocuproine exciton blocking layer, and 150 nm-thick, 1 mm-diameter Ag cathodes. Vacuum thermal deposition was performed at a base pressure of about $10^{-7}$ Torr. The neat $C_{60}$ acceptor layer is also thought to dissociate excitons generated in the porphyrin donor layer, prevent shorts, and maximize NIR absorption. Current-voltage characteristics were measured using a semiconductor parameter analyzer, and the EQE was measured using a lock-in amplifier with devices illuminated with monochromatic, chopped light at about 200 Hz.

Figure 6:
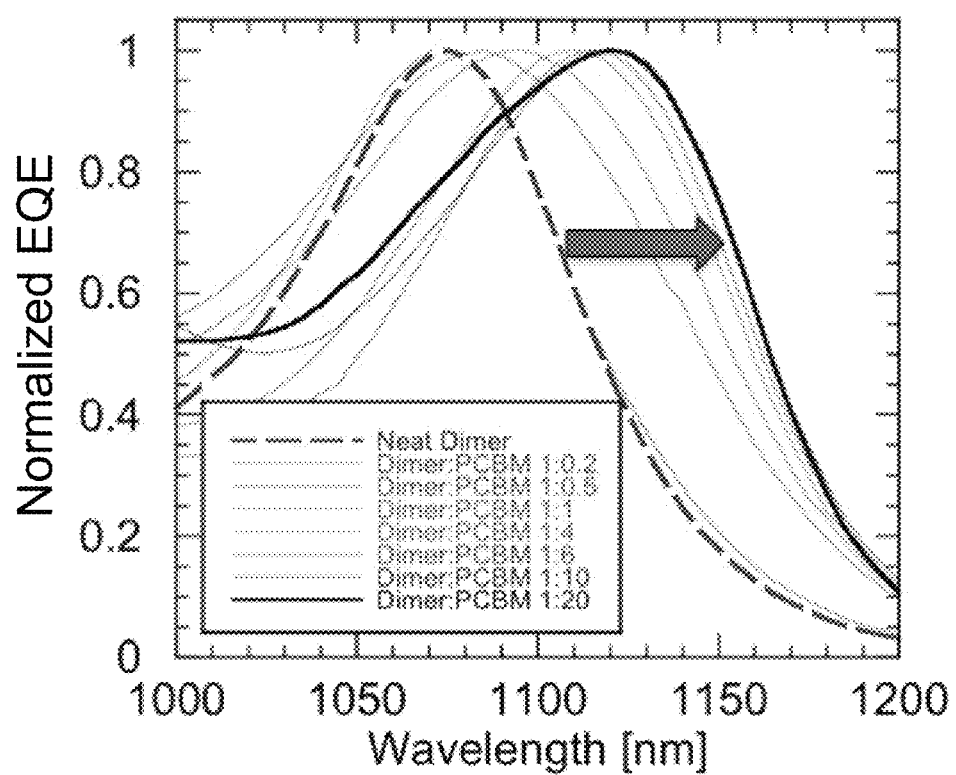
FIG. 6 is a chart showing normalized external quantum efficiency (EQE) spectra for photoactive devices that include metallated porphyrin dimers with various amounts of a fullerene compound as coordinating additive.

FIG. 6 shows how the addition of various amounts of the PCBM additive shifts the peak of the EQE spectrum of the porphyrin dimer shown in FIG. 4(d) (not fused) toward a higher wavelength range. The dashed curved is the EQE spectrum for the dimer alone, and the bold peak furthest to the right is the EQE spectrum for the dimer with PCBM added at a weight ratio of 1:20 dimer to PCBM. The red shift is approximately 45 nm as the concentration of PCBM in the composition is changed from pure Zn-porphyrin dimer to a 1:20 ratio. The ratio is reported as the ratio in the solution used to deposit the donor layer.

Figure 7:
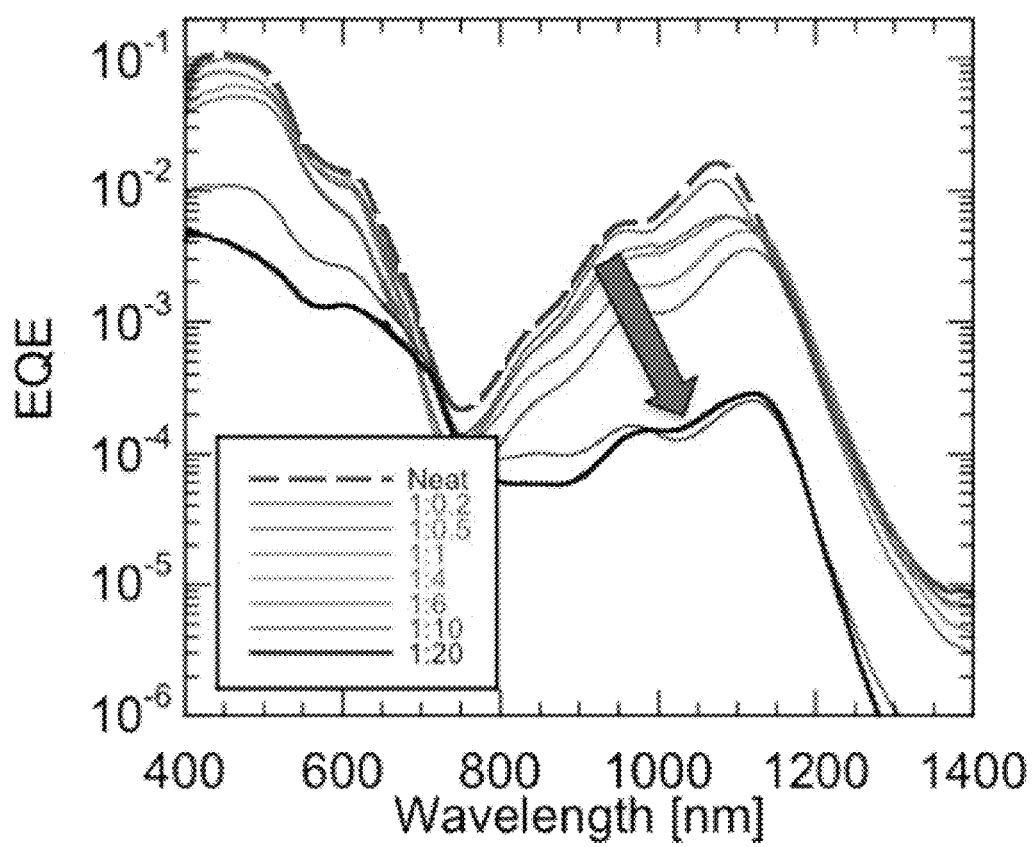
FIG. 7 is a chart showing EQE spectra for the same photoactive devices as in FIG. 6.

FIG. 7 shows the same spectrum over a broader wavelength range and without the EQE normalized. There is a deleterious effect on the EQE, especially where large amounts of PCBM are added. While the red shift is about 45 nm overall, the EQE decreases from about 2% to about 0.03% over the same PCBM concentration increase.

Figure 8:
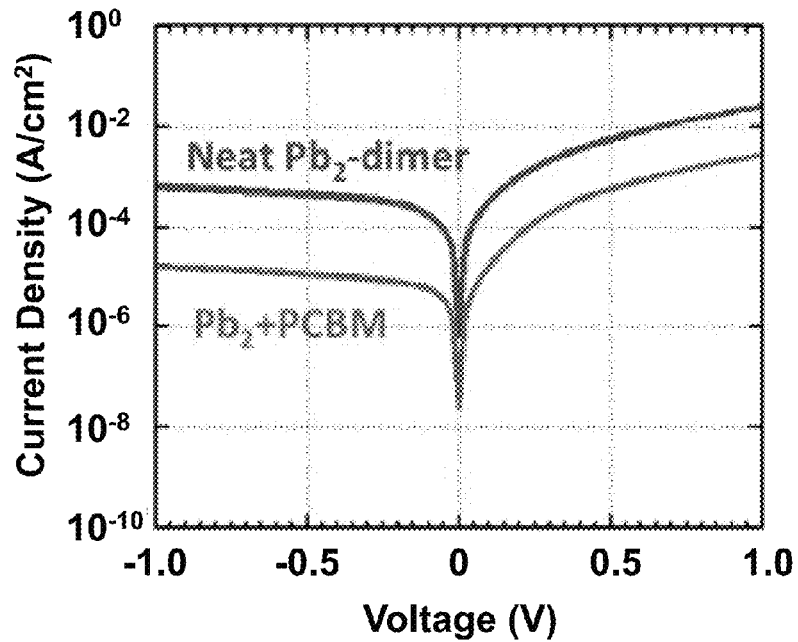
FIG. 8 is a chart showing current density as a function of voltage for photoactive devices that include metallated porphyrin dimers, both with and without a fullerene compound as a coordinating additive.
Figure 9:
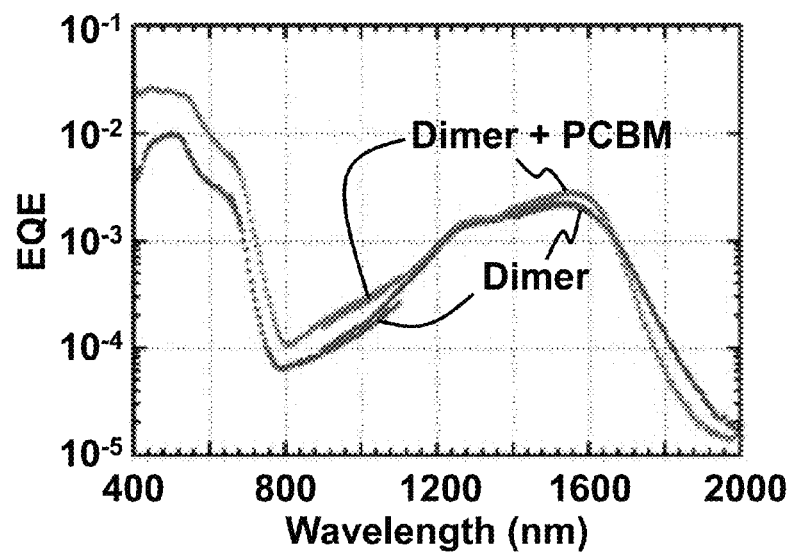
FIG. 9 is a chart showing EQE spectra for the same photoactive devices as in FIG. 8.
Figure 10:
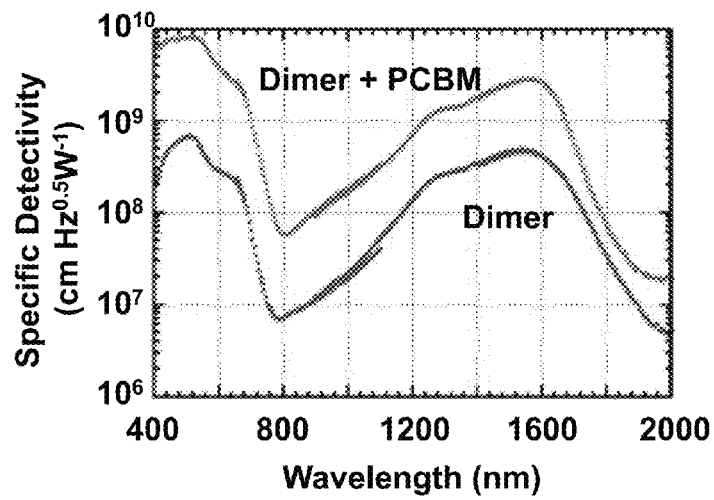
FIG. 10 is a chart showing specific detectivity spectra for the same photoactive devices as in FIGS. 8 and 9.

An additional effect is observed in some systems, where the addition of PCBM to the donor material decreases the dark current of the photoactive device. This can be useful in photodetector applications, as a smaller dark current reduces the noise of the detector, thus increasing the specific detectivity (D*) of the device. Here, $D^* = RA^{1/2}S_N^{-1}$, where R is the responsivity, A is the detector active area, and $S_N$ is the spectral noise density. FIG. 8 shows the effect of adding PCBM to a Pb-metallated porphyrin dimer having fused pyrene terminal groups. The weight ratio of Pb-dimer to PCBM was 1:1. There is about a 30-fold reduction in dark current with a minimal effect on the EQE (FIG. 9) and about an order of magnitude higher specific detectivity (FIG. 10) with the PCBM additive.

Figure 11:
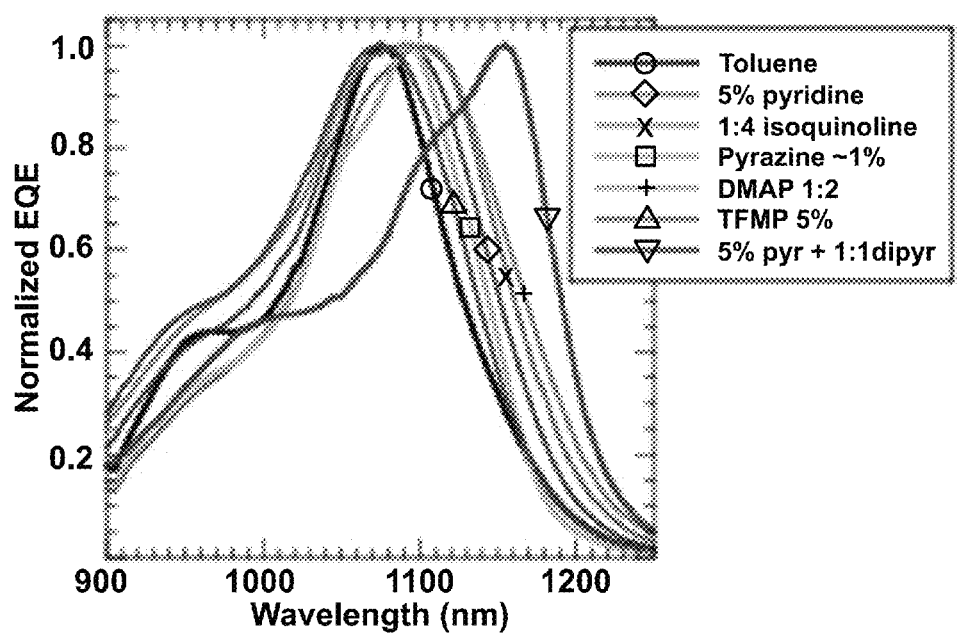
FIG. 11 is a chart showing normalized EQE spectra for photoactive devices that include metallated porphyrin dimers with various different coordinating additives.
Figure 12:
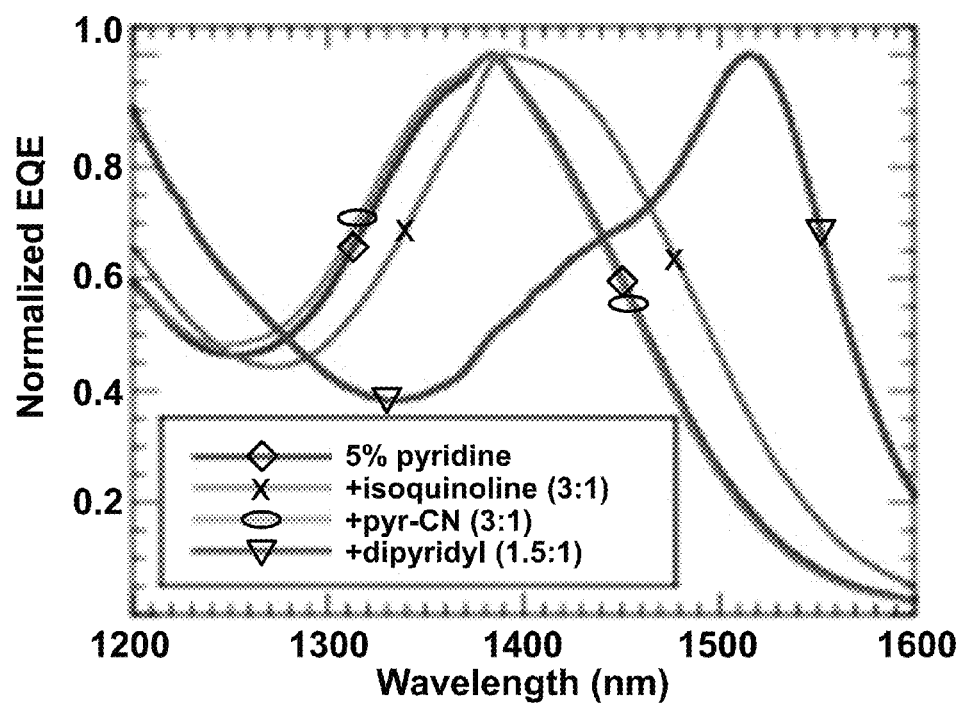
FIG. 12 is a chart showing normalized EQE spectra for photoactive devices that include metallated porphyrin trimers with various different coordinating additives.

In FIG. 11, EQE spectra are shown for Zn-porphyrin dimers (FIG. 4(d)) with various coordinating additives. Symbols have been added to the curves with a key to help differentiate the several spectra shown. No wavelength shift was observed with pyridine-4-carbonitrile or 4-trifluoromethylpyridine included as coordinating additives. But when pyridine compounds such as triazine or dimethyl amino pyridine were added, a red shift was observed. When a bidentate ligand such as 4,4'-bipyridine is included, an even larger red shift of about 80 nm is observed. FIG. 12 shows a similar effects with a Zn-porphyrin trimer.

Figure 13:
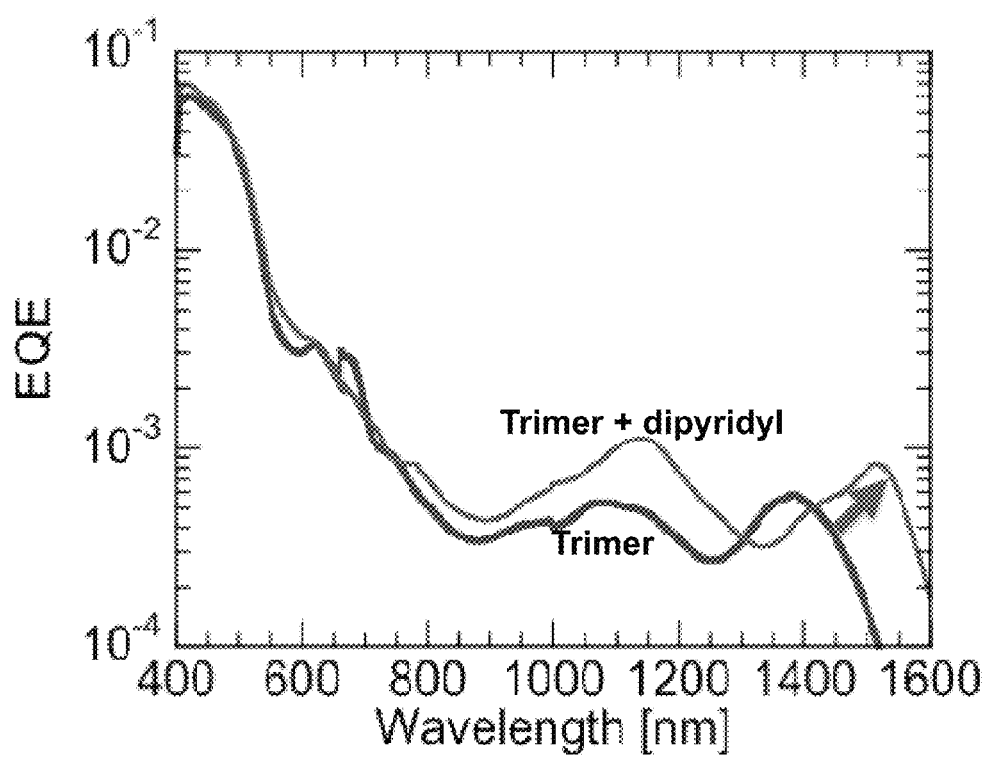
FIG. 13 is a chart showing EQE spectra for some of the same photoactive devices as in FIG. 12, where one device includes a dipyridyl coordinating additive and the other device does not include the dipyridyl coordinating additive.

As shown in FIG. 13, the 4,4'-bipyridine ligand also increases the EQE of the resulting devices. Additionally 4,4'-bipyridine decreases the resistance of the resulting device, indicating better charge transport properties. In this example of dipyridyl with Zn-porphyrin trimer, the resulting red shift is about 125 nm, and the increase in EQE is about 50%. It was observed that the addition of 4,4'-bipyridine may increase the dark current slightly.

Figure 14:
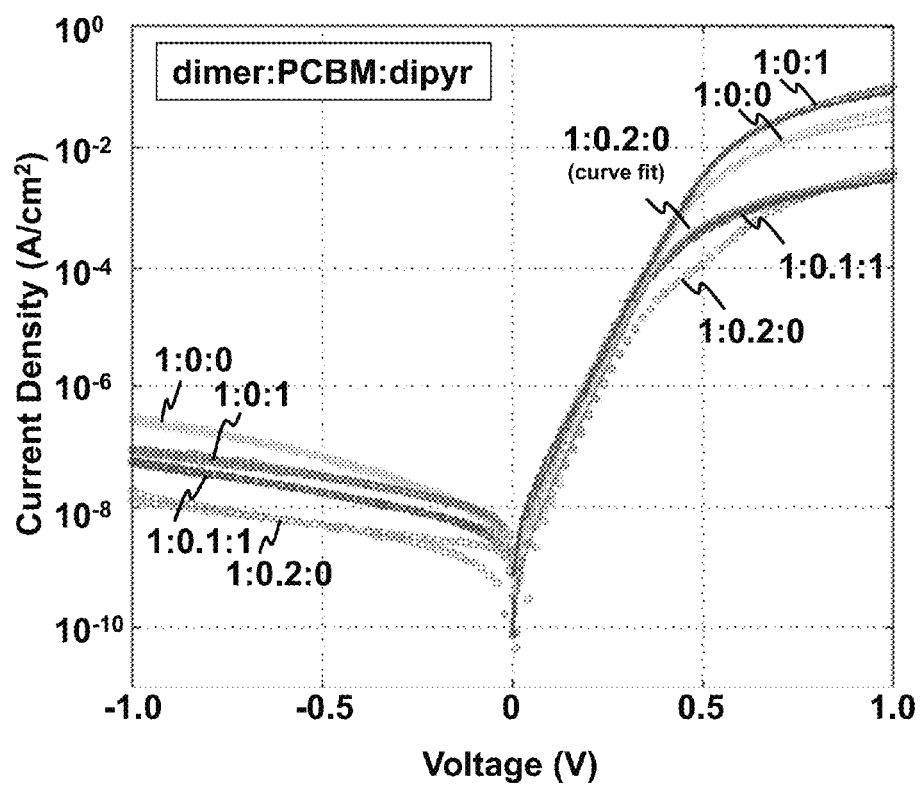
FIG. 14 is a chart showing current density as a function of voltage for photoactive devices that include metallated porphyrin dimers with different combinations of a fullerene compound and a bidentate ligand as coordinating additives.
Figure 15:
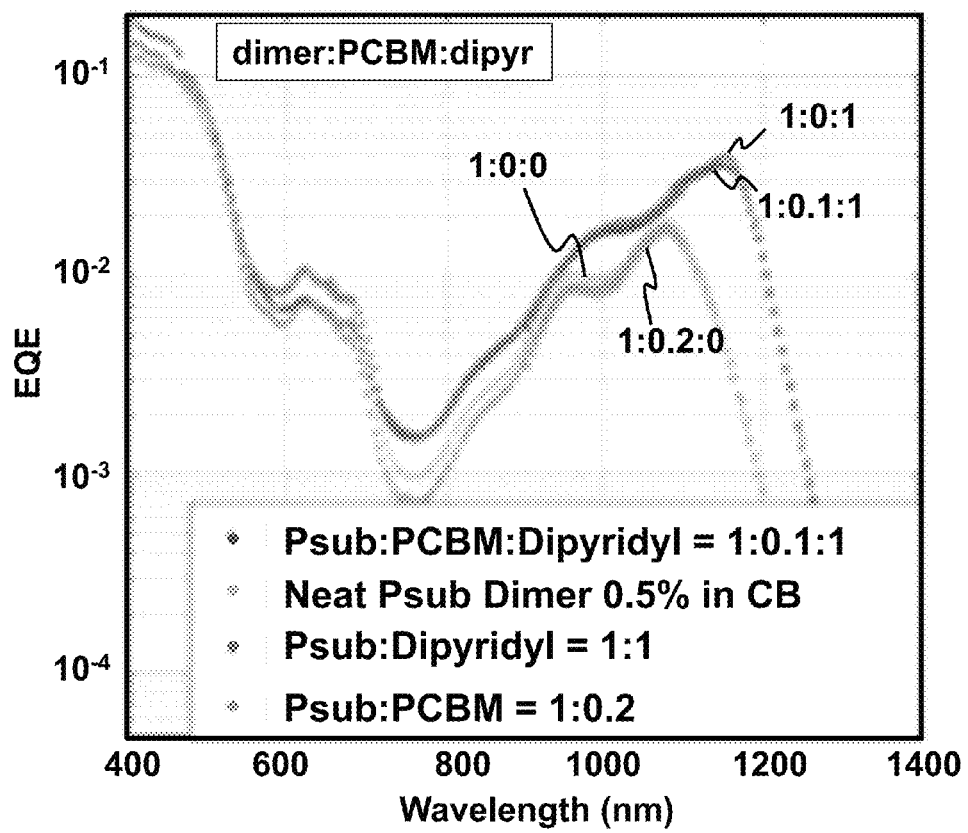
FIG. 15 is a chart showing EQE spectra for the same photoactive devices as in FIG. 14.
Figure 16:
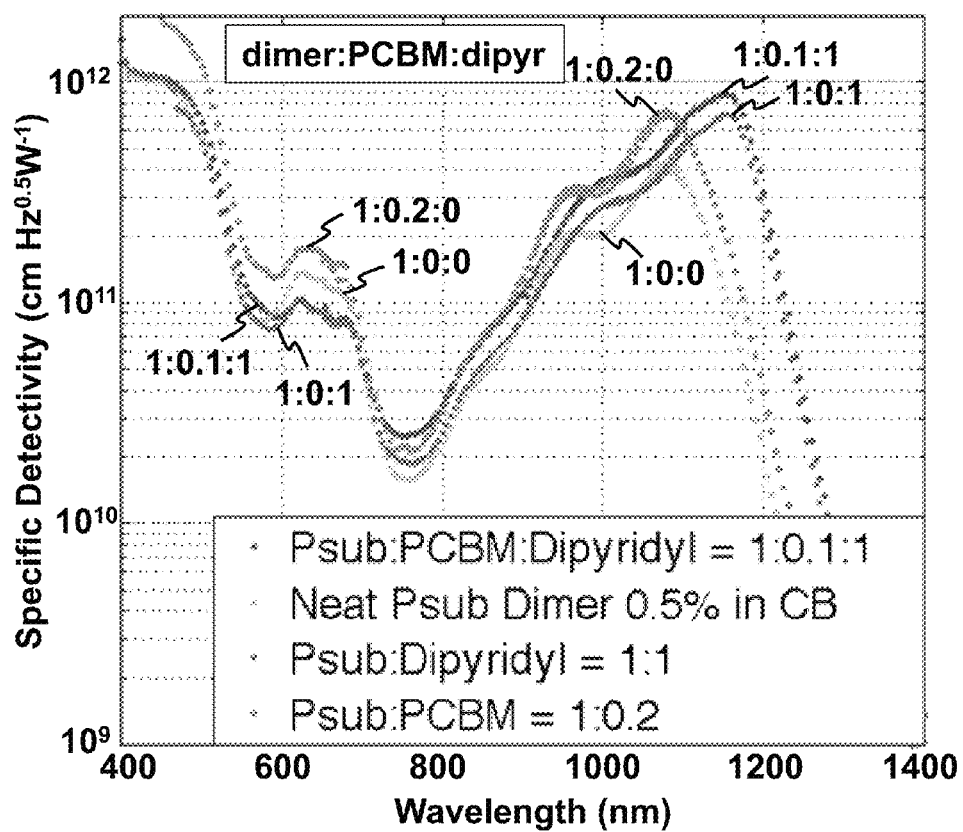
FIG. 16 is a chart showing specific detectivity spectra for the same photoactive devices as in FIGS. 14 and 15.

FIGS. 14-16 show the effects of combining a fullerene compound with another coordinating additive having free electron pairs and adding them to a porphyrin oligomer to construct a photoactive device. In particular, FIGS. 14-16 show the combined effects of adding both PCBM and 4,4'-bipyridine to the material Zn-porphyrin dimer of FIG. 4(d). The dark current can be decreased (FIG. 14) and the EQE (FIG. 15) and Specific Detectivity (FIG. 16) are improved. A 1:0.1:1 ratio of Zn-dimer:PCBM:dipyridyl produced a photoactive device with peak responsivity red-shifted by about 70 nm and with an increased EQE of about 4% and specific detectivity of 9×10" Jones at 1150 nm. The decrease in dark current may be explained by a shift in the HOMO energy, as measured by ultraviolet photoelectron spectroscopy, of the Zn-dimer shifting from −4.58±0.12 eV for the neat dimer to −4.72±0.05 eV when PCBM is added (1:0.1 molar ratio), and up to −4.54±0.05 eV when dipyridyl is added (1:1 molar ratio).

Figure 17:
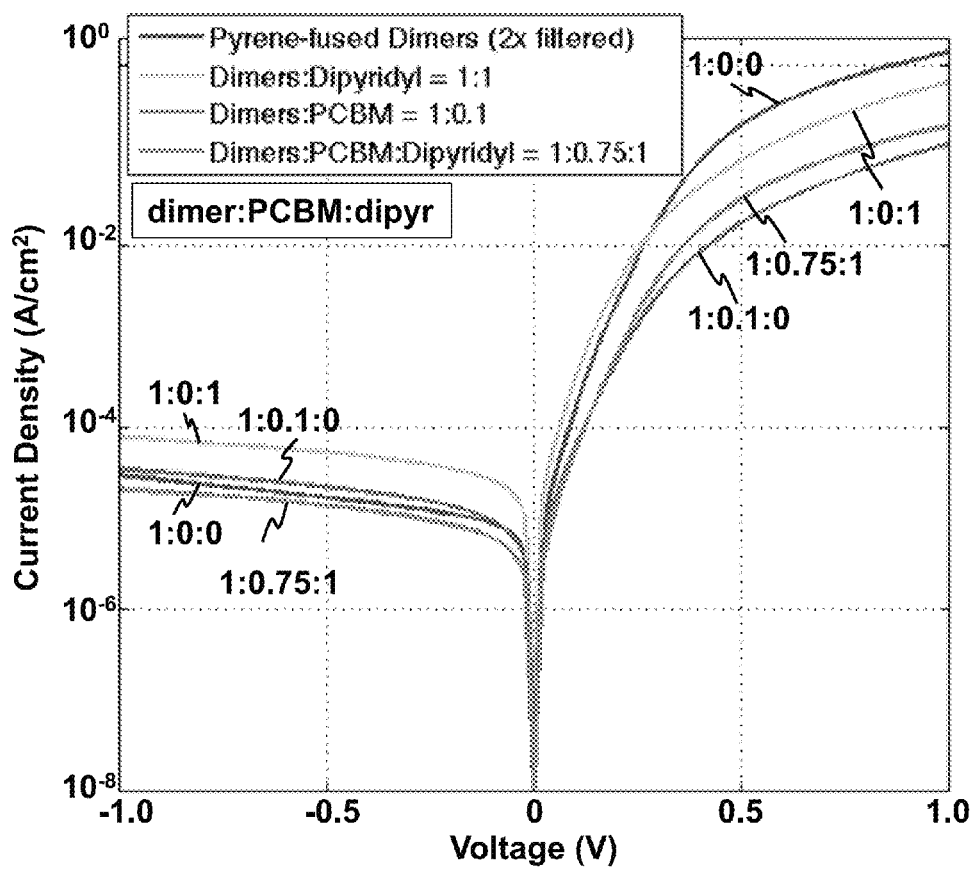
FIG. 17 is a chart showing current density as a function of voltage for photoactive devices that include other combinations of metallated porphyrin dimers with a fullerene compound and a bidentate ligand as coordinating additives.
Figure 18:
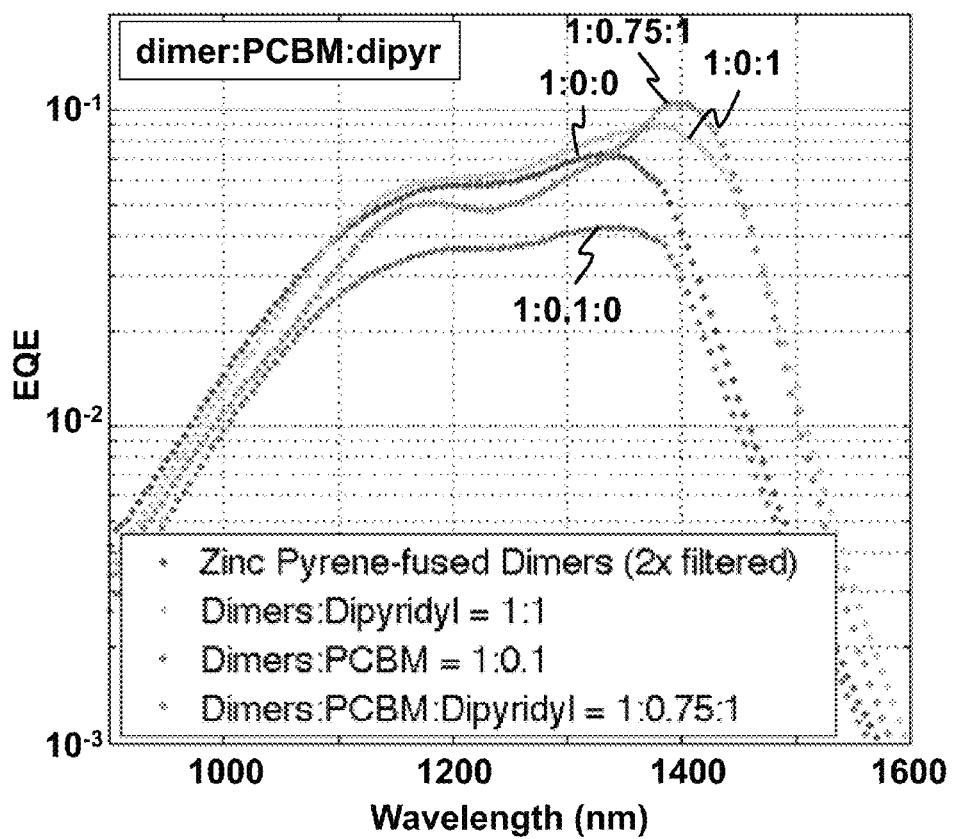
FIG. 18 is a chart showing EQE spectra for the same photoactive devices as in FIG. 17.
Figure 19:
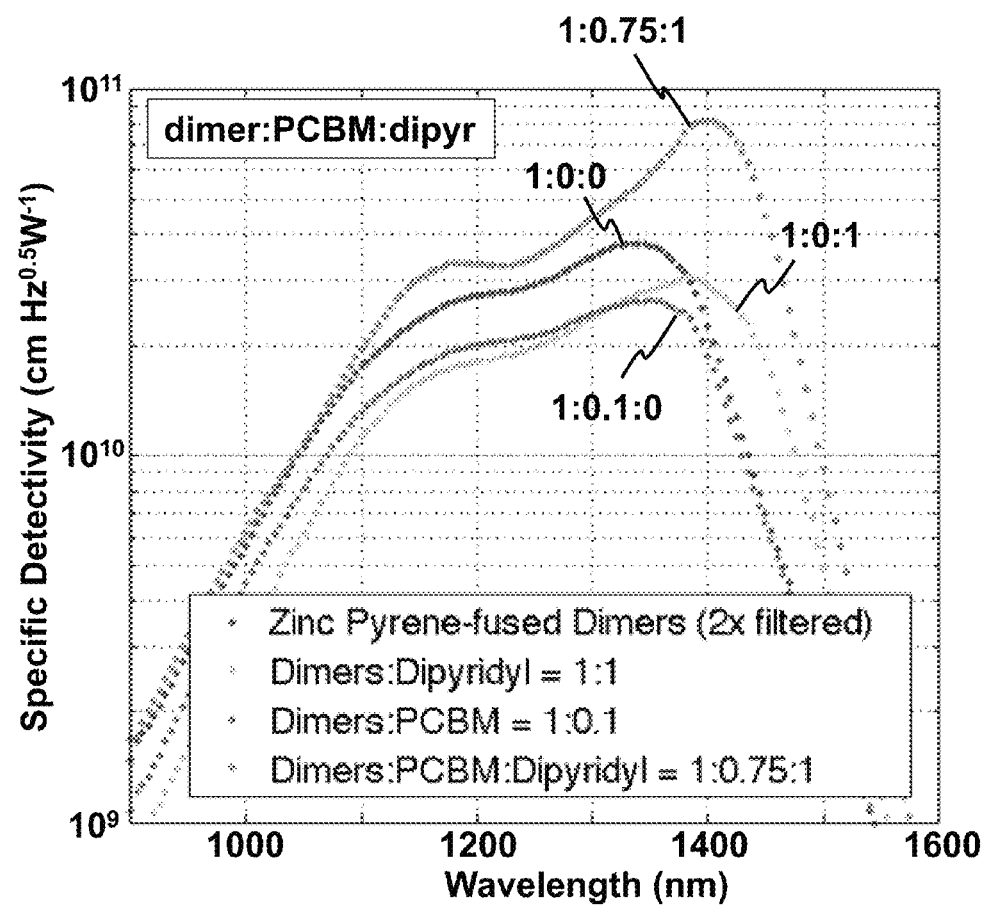
FIG. 19 is a chart showing specific detectivity spectra for the same photoactive devices as in FIGS. 17 and 18.

FIGS. 17-19 show the effects of adding 4,4'-bipyridine and PCBM to Zn-Pfused devices. EQE values up to 10.5% have been observed with a molar ratio of 1:0.75:1 (Pfused:PCBM:dipyridyl).

Accordingly, a method of modifying the photoelectric properties of an organic photoactive material can be described as follows. One embodiment of the method includes the steps of providing a photoactive material having a characteristic EQE spectrum with at least one EQE peak when paired with another material to form a heterojunction, and adding a coordinating additive to the material that shifts the at least one EQE peak. The adding step that shifts the EQE peak can red-shift the peak—i.e., shift it toward higher wavelengths. The adding step may alternatively or additionally shift the peak by increasing the maximum value of the EQE peak. The at least one EQE peak may include a near-infrared (NIR) peak and/or other EQE peaks. The adding step can shift only one EQE peak or a plurality of EQE peaks of the characteristic spectrum, and individual peaks may be independently red-shifted and/or increased in maximum value.

In a second set of experiments, donor layers including zinc-metallated tetraphenylporphyrin (ZnTPP) and a coordinating additive were deposited, with the additive being deposited via vapor deposition subsequent to the deposition of a layer of ZnTPP. The coordinating additives used in these device constructions included pyrazine, pyridine, and triazine as examples of monodentate, bidentate, and tridentate ligands having one, two and three nitrogen free electron pairs, respectively. Device construction included multiple deposition steps over ITO-coated glass substrates, where ITO layer thickness was about 150±10 nm, ITO sheet resistance was about 20±5 $\Omega/cm^2$, and optical transmission was about 84% at 550 nm. The coated substrates were cleaned with soap and boiled in tetrachloroethylene, acetone, and propanol for 5 minutes each. The coated substrates were then exposed to an ozone atmosphere (UVOCS T10X10/OES) for 10 minutes immediately before loading into a high vacuum chamber ($1-3\times10^{-6}$ Torr). Each subsequently deposited device layer, including organic layers and aluminum metal second electrode layers, was deposited over the ITO-coated substrate at a rate of about 0.2 nm/s.

After deposition of a 15 nm layer of ZnTPP for each device, the layered structures were removed from the vacuum chamber and exposed to vapors of the desired coordinating additives for 4 minutes in a container and in a nitrogen atmosphere. The vapor deposition of the coordinating additives was conducted at ambient conditions (760 Torr and 23-28° C.). After being exposed to the coordinating additive vapor, the coated substrates were loaded back into the vacuum chamber for deposition of a $C_{60}$ acceptor layer having a thickness of about 40 nm and an overlying BCP buffer layer having a thickness of about 10 nm. Aluminum electrodes were then deposited under air using 1 mm diameter masks at a thickness of about 100 nm.

Figure 20:
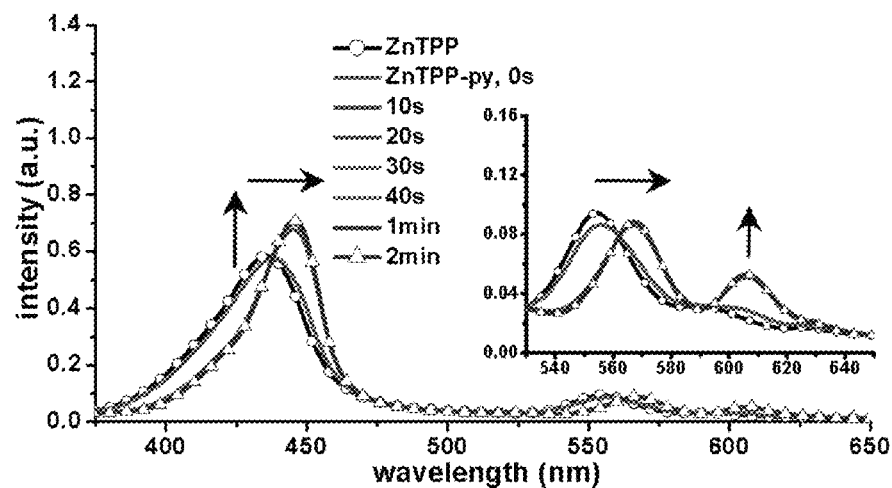
FIG. 20 is a chart showing UV-visible spectra taken in situ for zinc-metallated tetraphenylporphyrin (ZnTPP) during exposure to a vapor of coordinating additive, where the additive is pyridine.
Figure 21:
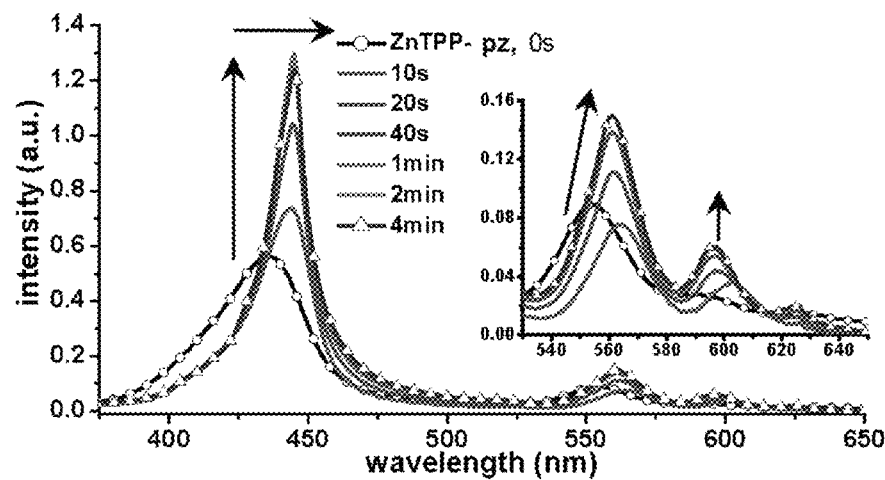
FIG. 21 is a chart showing UV-visible spectra taken in situ for ZnTPP during exposure to a vapor of coordinating additive, where the additive is pyrazine.
Figure 22:
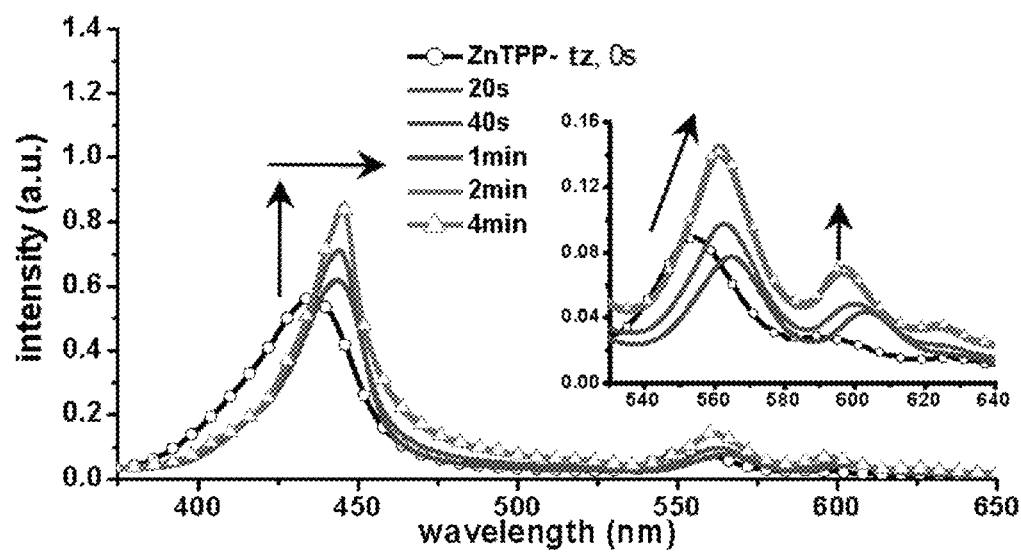
FIG. 22 is a chart showing UV-visible spectra taken in situ for ZnTPP during exposure to a vapor of coordinating additive, where the additive is triazine.

In situ UV-vis absorption measurements were performed while the ZnTPP layers were exposed to vapors of the coordinating additives. The color change resulting from coordination bonding of the ZnTPP with ligand vapors was visually observed. UV-vis spectra recorded over time are shown in FIGS. 20-22 for pyridine, pyrazine, and triazine, respectively. The insets of FIGS. 20-22 are the same spectra shown over a narrower wavelength range corresponding to the Q-band range. The temporal changes in the spectra are readily apparent. As the ZnTPP layer incorporates the additives, the Soret and Q-bands undergo bathochromic shifts. The Soret and Q-bands sharpen, and the vibrational feature of the Q-band intensifies as the process progresses, particularly during treatment with pyrazine and triazine. These changes in peak shape after vapor exposure indicate increased organization in the ZnTPP films. Measurement of $^1H$ NMR spectra of solutions made by washing off the films after exposure to pyrazine and triazine indicated that the films contained a 1:1 ratio of ZnTPP to coordinating additive.

Figure 23:
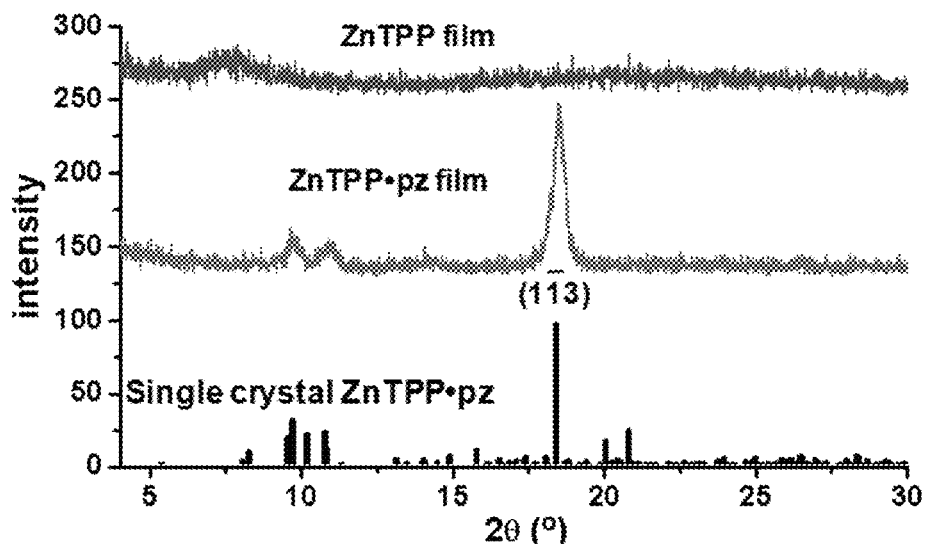
FIG. 23 is a chart showing X-ray diffraction (XRD) patterns taken from a layer of ZnTPP and a layer of ZnTPP after exposure to a vapor of pyrazine coordinating additive, and also showing a simulated diffraction pattern for a single crystal of ZnTPP.pz.
Figure 24:
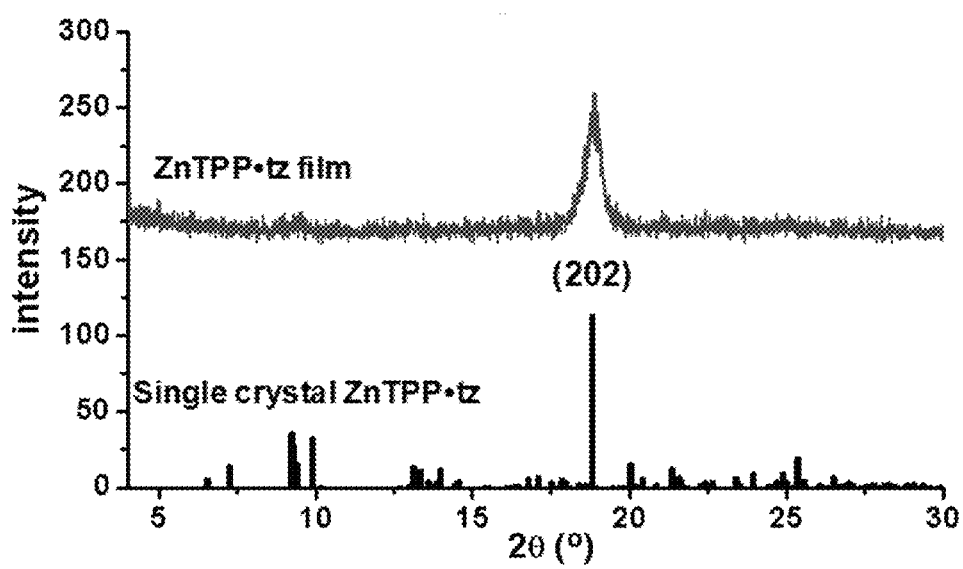
FIG. 24 is a chart showing an XRD pattern taken from a layer of ZnTPP after exposure to a vapor of triazine coordinating additive, and also showing a simulated diffraction pattern for a single crystal of ZnTPP.tz.

Changes in film morphology were further characterized by X-ray diffraction (XRD) studies on 100 nm ZnTPP films before and after exposure to vapors of pyrazine (pz) and triazine (tz). The diffraction patterns of ZnTPP, ZnTPP.pz and ZnTPP.tz films are shown in FIGS. 23 and 24. As shown in FIG. 23, before vapor exposure, the ZnTPP layer is amorphous with no diffraction peaks present. After vapor exposure, the films are structurally ordered with diffraction peaks appearing at various 2θ angles. FIGS. 23 and 24 also compare the diffraction patterns of the vapor-exposed ZnTPP films to simulated diffraction patterns from single crystals of ZnTPP.tz and ZnTPP.pz. The most intense peaks in the XRD patterns of ZnTPP.pz and ZnTPP.tz films at 2θ=18.5° and 18.8°, respectively, are X-ray diffraction from planes parallel to the porphyrin rings. These experimental results indicate the organization of disordered ZnTPP films to a highly ordered structure with stacked parallel macrocycles as the result of exposure to vapors of coordinating additives.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. An organic photoactive device, comprising:
   a substrate;
   first and second electrodes supported by the substrate; and
   a donor material and an acceptor material arranged together to form a heterojunction between the first and second electrodes, wherein at least one of the donor or acceptor materials includes a metallated porphyrinoid and at least one coordinating additive.

2. The organic photoactive device of claim 1, wherein the porphyrinoid comprises a porphyrin or a phthalocyanine or both.

3. The organic photoactive device of claim 1, wherein the porphyrinoid comprises a covalent porphyrin dimer or trimer.

4. The organic photoactive device of claim 3, wherein the dimer or trimer further comprises fused aromatic terminal groups.

5. The organic photoactive device of claim 1, wherein the porphyrinoid is metallated with zinc.

6. The organic photoactive device of claim 1, wherein the at least one coordinating additive comprises a fullerene compound.

7. The organic photoactive device of claim 6, wherein the fullerene compound is PCBM.

8. The organic photoactive device of claim 1, wherein the at least one coordinating additive includes a bidentate ligand.

9. The organic photoactive device of claim 1, wherein the at least one coordinating additive includes a compound having at least one nitrogen free electron pair.

10. The organic photoactive device of claim 9, wherein the at least one coordinating additive further includes a fullerene compound.

11. The organic photoactive device of claim 9, wherein the compound having at least one nitrogen free electron pair is pyrrole, imidazole, pyridine, pyrazine, triazine, pyridine-4- carbonitrile, 4-trifluoromethylpyridine, dimethyl amino pyridine, quinoline, an amine, a naphthyridine, a dipyridyl, or any combination thereof.

12. The organic photoactive device of claim 9, wherein the compound having at least one nitrogen free electron pair is 4,4'-bipyridyl, 1,4-diaminobenzene, 2,6-naphthyridine, or any combination thereof.

13. The organic photoactive device of claim 1, wherein the donor material includes the metallated porphyrinoid and the at least one coordinating additive, and the acceptor material comprises a fullerene compound.

14. The organic photoactive device of claim 1, wherein the heterojunction comprises a bulk heterojunction.

15. The organic photoactive device of claim 1, wherein the heterojunction comprises a planar-mixed heterojunction.

16. The organic photoactive device of claim 1, wherein the heterojunction comprises a planar heterojunction formed at an interface between a layer of the donor material and a layer of the acceptor material.

17. The organic photoactive device of claim 16, wherein the layer of donor material comprises:
    a covalent porphyrin dimer or trimer having fused pyrene terminal groups;
    PCBM; and
    a bidentate ligand.

18. An organic photoresponsive device comprising the photoactive device of claim 1.

19. An organic light emitting device comprising the photoactive device of claim 1.

20. A photoactive device, comprising:
    a substrate;
    first and second electrodes supported by the substrate; and
    a fullerene compound and a material arranged together between the electrodes as a heterojunction, said material having a supramolecular structure comprising metal ions coordinated with both macrocyclic ligands and bidentate axial ligands, wherein the axial ligands form coordination bonds with the metal ions of adjacent macrocyclic ligands.

21. The photoactive device of claim 20, wherein the macrocyclic ligands include porphyrins or phthalocyanines or both.

22. The photoactive device of claim 20, wherein the macrocyclic ligands include covalent porphyrin oligomers coordinated with a plurality of metal ions.

23. The photoactive device of claim 20, wherein the coordination bonds each include a nitrogen atom interacting with one of the metal ions.

24. The photoactive device of claim 20, wherein the axial ligands include diamines, dipyridyls, pyrazine, naphthyridines, or any combination thereof.

25. The photoactive device of claim 20, wherein the supramolecular structure further comprises fullerene compounds that axially coordinate at least some of the macrocyclic ligands.

26. The photoactive device of claim 20, wherein said material is formed as a donor layer in surface contact with an acceptor layer comprising the fullerene compound.

27. The photoactive device of claim 26, wherein the acceptor layer comprises $C_{60}$.

28. A photoactive device including a pair of electrodes with a photoactive material arranged between the electrodes, wherein the photoactive material is modified according to the steps of:
    providing a photoactive material comprising a metallated porphyrin dimer or trimer and having a characteristic EQE spectrum with at least one EQE peak when paired with another material to form a heterojunction; and
    adding at least one coordinating additive to the material that either shifts the at least one EQE peak toward higher wavelengths or increases a maximum value of the at least one EQE peak, or both.

* * * * *